United States Patent [19]

Nagano

[11] 4,409,497
[45] Oct. 11, 1983

[54] WINDOW COMPARATOR CIRCUIT

[75] Inventor: Katsumi Nagano, Hiratsuka, Japan

[73] Assignee: Tokyo Shibaura Denki Kabushiki Kaisha, Kawasaki, Japan

[21] Appl. No.: 262,498

[22] Filed: May 11, 1981

[30] Foreign Application Priority Data

May 29, 1980 [JP] Japan .................................. 55-71722

[51] Int. Cl.³ ........................ H03K 5/153; H03K 5/24; G01R 19/165
[52] U.S. Cl. .................................... 307/360; 307/261; 328/147
[58] Field of Search ....................... 307/360, 362, 261; 328/115, 116, 117, 147

[56] References Cited

U.S. PATENT DOCUMENTS 4,292,552  9/1981  Tanaka ................................ 307/360
4,321,482  3/1982  Schröder et al. .................... 307/360

OTHER PUBLICATIONS

J. G. Graeme, G. E. Tobey and L. P. Huelsman, *Operational Amplifiers*, pp. 364–366 (1971).

Primary Examiner—John Zazworsky
Attorney, Agent, or Firm—Finnegan, Henderson, Farabow, Garrett & Dunner

[57] ABSTRACT

A window comparator circuit includes an input terminal, first and second reference voltage terminals to be supplied with first and second voltages different from each other, first and second comparators connected to one of the first and second reference voltage terminals and to the input terminal, and an output circuit connected to output terminals of the first and second comparators. The first comparator comprises first and second transistors whose bases are coupled to the first reference voltage terminal and input terminal and whose emitters are connected to each other, and a first constant current source for supplying a first current connected to commonly-connected emitters of the first and second transistors; the second comparator comprises third and fourth transistors whose bases are connected to the input terminal and second reference voltage terminal and whose emitters are connected to each other, and a second constant current source for supplying the first current connected to commonly-connected emitters of the third and fourth transistors; and the output circuit comprises a current mirror circuit to which is supplied with the sum of collector currents of the second and fourth transistors and to the output of which is connected to a third constant current source for supplying a second constant current which is a half of the first current, and an output transistor whose base is connected to an output terminal of the current mirror circuit.

3 Claims, 12 Drawing Figures

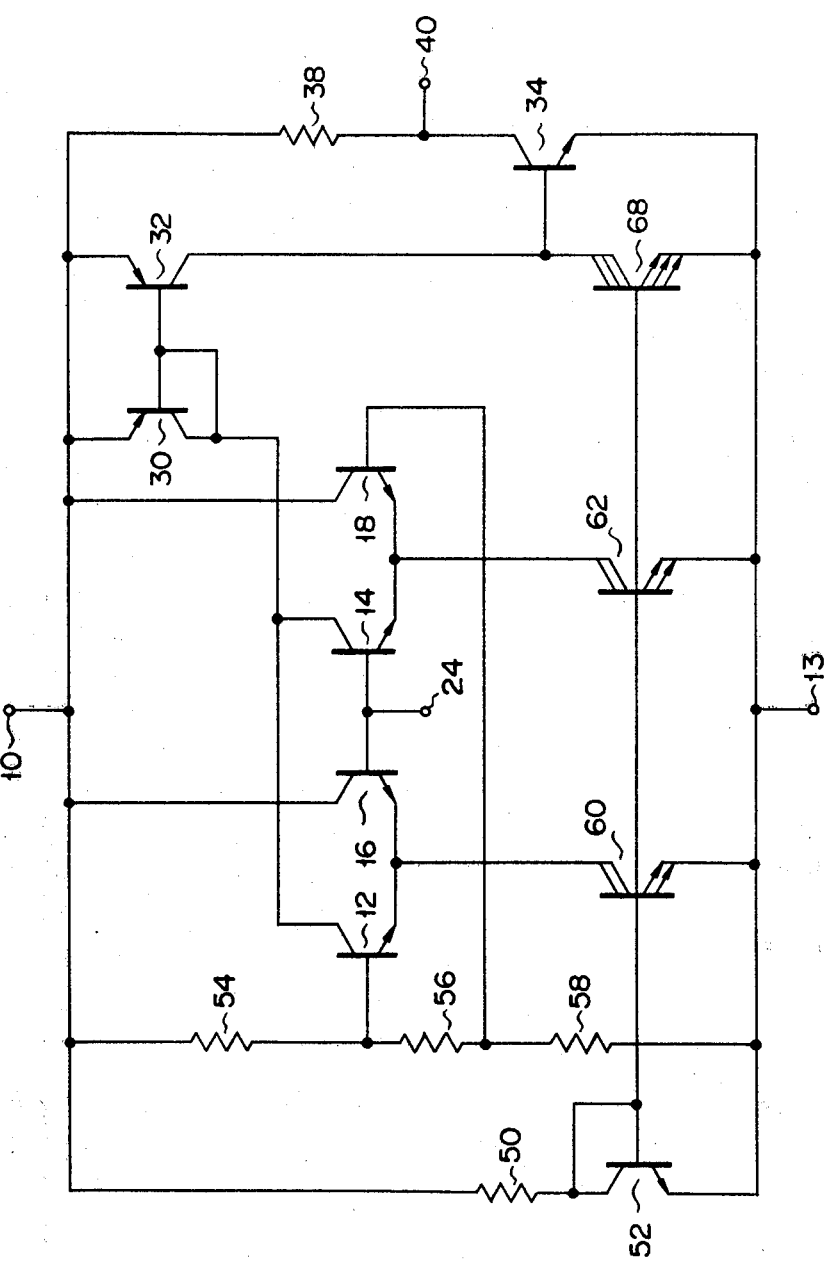

4,409,497

WINDOW COMPARATOR CIRCUIT

BACKGROUND OF THE INVENTION

The present invention relates to a window comparator circuit and, more particularly, a window comparator circuit suitable for integrating.

Various window comparator circuits have been provided to determine whether or not a signal voltage is in a predetermined voltage range. One of these circuits which processes only an input signal whose polarity is not changed includes first and second reference voltage supply terminals of high and low levels whose polarities are the same as that of the input signal, two comparators and a NAND gate. The first reference voltage supply terminal and signal input terminal are connected to noninverting and inverting input terminals of the first comparator, respectively. The signal input terminal and second reference voltage supply terminal are connected to noninverting and inverting input terminals of the second comparator, respectively. Output terminals of the first and second comparators are adapted to be connected to a signal output terminal through the NAND gate. In the case of a circuit thus arranged, an output voltage becomes L level when the input voltage is lower than the second reference voltage or higher than the first reference voltage and H level when the input voltage is higher than the second reference voltage or lower than the first reference voltage.

About sixth elements are required to form this conventional window comparator circuit by means of standard gate circuits, thus making the conventional window comparator circuit unsuitable for integrating.

SUMMARY OF THE INVENTION

The object of the present invention is to provide a window comparator circuit which can be realized by a smaller number of elements and is suitable for integrating.

This object can be achieved by a window comparator circuit comprising an input terminal to be supplied with an input signal; a first reference voltage terminal to be supplied with a first voltage; a second reference voltage terminal to be supplied with a second voltage lower than the first voltage; a first differential amplifier having a first transistor whose base is connected to the first reference voltage terminal, and a second transistor whose base is connected to the input terminal and whose emitter is connected to an emitter of the first transistor, a first constant current source for supplying a first constant current and connected to the emitters of the first and second transistors; a second differential amplifier having a third transistor whose base is connected to the input terminal, and a fourth transistor whose base is connected to the second reference voltage terminal and whose emitter is connected to an emitter of the third transistor; a second constant current source for supplying a second constant current having the same value as the first constant current and connected to the emitters of the third and fourth transistors; a current mirror circuit to be supplied with one of the sum of collector currents of the second and fourth transistors and the sum of collector currents of the first and third transistors; a third constant current source for supplying a third constant current and connected to an output terminal of the current mirror circuit; and an output transistor whose base is connected to the output terminal of the current mirror circuit.

BRIEF DESCRIPTION OF THE DRAWINGS

FIG. 6 is a circuit diagram of the second embodiment in detail.

DETAILED DESCRIPTION OF THE PREFERRED EMBODIMENTS

Figure 1:
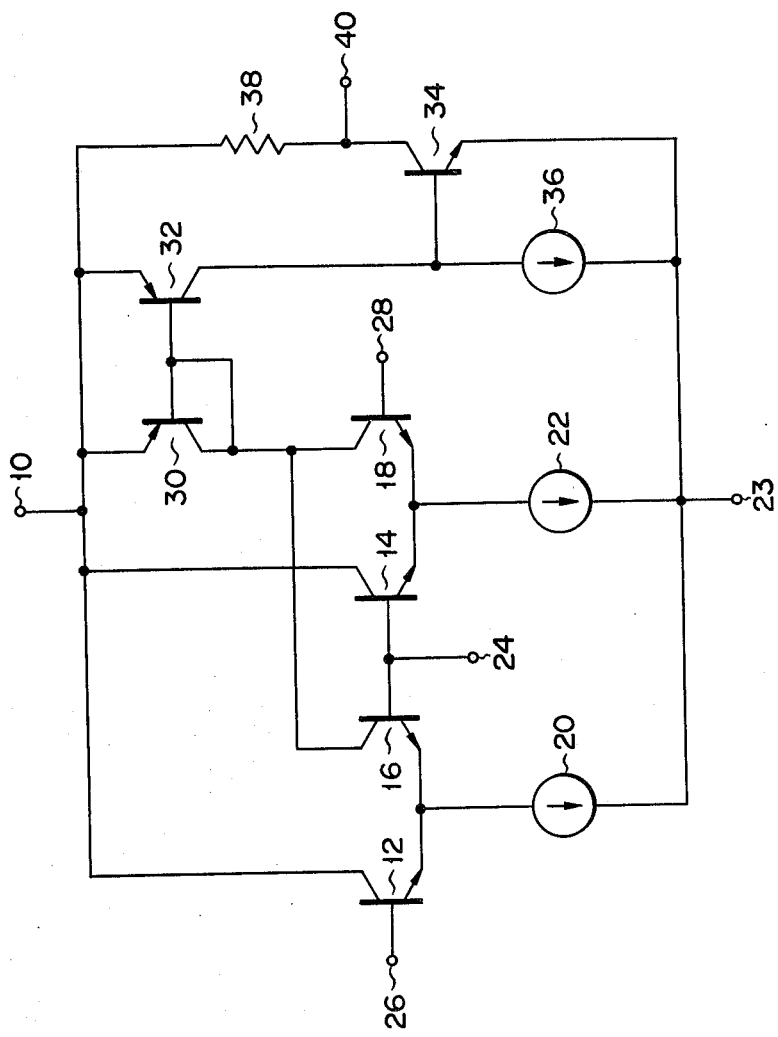
FIG. 1 is a circuit diagram of a first embodiment of a window comparator circuit according to the present invention.

An embodiment of a window comparator circuit according to the present invention will be now described with reference to the drawings. FIG. 1 is a circuit diagram of the first embodiment. A first power source terminal 10 is connected to collectors of NPN-type transistors 12 and 14, whose emitters are respectively connected to emitters of NPN-type transistors 16 and 18 and via constant current sources 20 and 22 to a second power source terminal 23.

Bases of transistors 14 and 16 are connected to each other and to a signal input terminal 24. The base of the transistor 12 is connected to a first reference voltage terminal 26 and the base of the transistor 18 to a second reference voltage terminal 28. Voltages appearing at first and second reference voltage terminals 26 and 28 are of same polarity as that of input signals, and the first reference voltage has an absolute value larger than that of the second reference voltage.

Collectors of transistors 16 and 18 are connected to each other and to a collector of a PNP-type transistor 30, whose collector and base are short-circuited with each other and whose base is connected to a base of a PNP-type transistor 32. Emitters of the transistors 30 and 32 are connected to the first power source terminal 10, and the transistors 30 and 32 form a current mirror circuit.

A collector of the transistor 32 is connected to a base of an NPN-type transistor 34 and via a constant current source 36 to the second power source terminal 23. Providing that a current generated through the constant current source 36 be represented by I, currents generated through constant current sources 20 and 22 are under a relation of 2I. A collector of transistor 34 is connected via a resistor 38 to the first power source terminal 10 and connected to an output terminal 40. An emitter of the transistor 34 is connected to the second power source terminal 23.

It is assumed to describe the operation of the embodiment thus arranged that, at the start of operations, a voltage appearing at the first power source terminal 10 be represented by $V_1$, a voltage appearing at the second power source terminal 23 is 0, voltages appearing at first and second reference voltage terminals Vh respectively, and Vl, and an input signal Vi be of positive polarity ($V_1 > Vh > Vl > 0$). When the input voltage Vi is made sufficiently lower than the first reference voltage Vh, the transistor 12 is rendered conductive while the transistor 16 becomes nonconductive, and all of the current 2I of the constant current source 20 flows only through the transistor 12.

When input voltage Vi goes near to the Vh, the transistor 16 is also made conductive and a little current flows to the transistor 16. When the input voltage Vi becomes equal to the Vh, the transistors 12 and 16 are made equally conductive and the current I resulted from dividing the current of the constant current source 20 into two equal parts flows through the transistors 12 and 16, respectively.

Figure 2A:
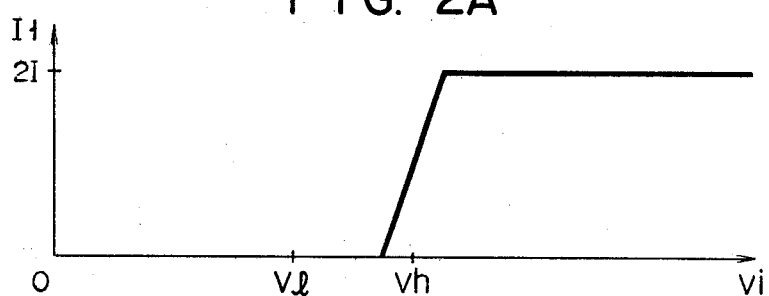
FIGS. 2A through 2D show signal waveforms in main parts of the circuit of FIG. 1.

When the input voltage Vi is sufficiently higher than the Vh, the transistor 16 is then rendered conductive while the transistor 12 becomes nonconductive, all of the current 2I of the constant current source 20 flows only through the transistor 16. Therefore, providing that a collector current of the transistor 16 be represented by $I_1$, $I_1$ varies according to the change of the input voltage Vi as shown in FIG. 2A. The change of $I_1$ when Vi≈Vh is practically curved, but shown by a straight line approximately to the curve in FIG. 2A.

When the input voltage VI is sufficiently lower than the second reference voltage Vl, the transistor 14 is made nonconductive while the transistor 18 is conductive, and all of the constant current 2I of the constant current source 22 flows only through the transistor 18. When the input voltage Vi rises near to the Vl, the transistor 14 is also rendered conductive and a little current flows through the transistor 14. When the input voltage Vi becomes equal to the Vl, the transistors 14 and 18 are made equally conductive, and the current I resulted from dividing current of the constant current source 22 flows through the transistors 14 and 18, respectively.

Figure 2B:
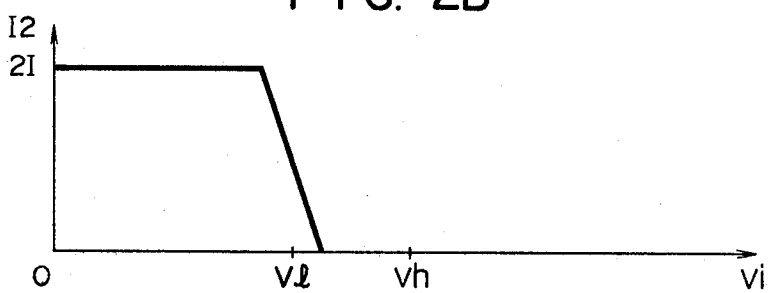

When the input voltage Vi becomes sufficiently higher than the Vl, the transistor 14 is then made conductive while the transistor 18 becomes nonconductive, and all of the constant current 2I of the constant current source 22 flows only through the transistor 14. Therefore, providing that a collector current of the transistor 18 be represented by $I_2$, $I_2$ varies relative to the input voltage Vi as shown in FIG. 2B. The change of $I_2$ when Vi≈Vl is approximated to a straight line in FIG. 2B.

Figure 2C:
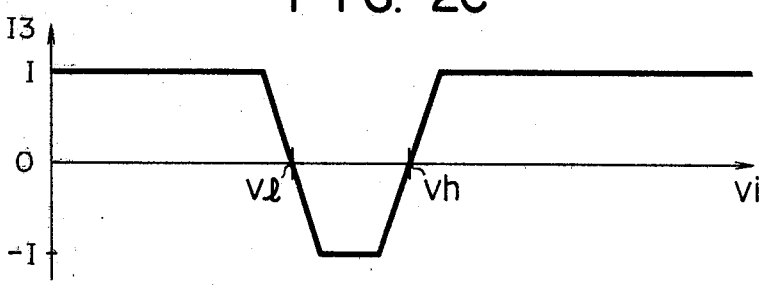

Since the collector currents $I_1$ and $I_2$ of the transistors 16 and 18 flow into the input side transistor 30 of the current mirror circuit, the collector current of the output side transistor 32 of the current mirror circuit is the sum of $I_1$ and $I_2$. Since the constant current source 36 for supplying constant current I is connected to the collector of the transistor 32, a base current $I_3$ of the transistor 34 varies relative to the input voltage Vi as shown in FIG. 2C. Namely, $I_3$ has a waveform corresponding to the one which is formed by unifying waveforms of $I_1$ and $I_2$ and then shifting it by I to the negative side.

Figure 2D:
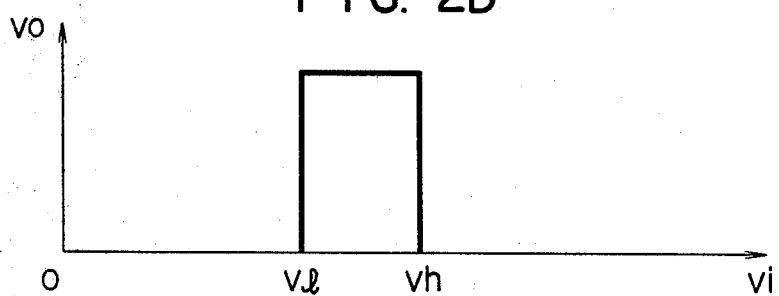

The transistor 34 becomes conductive when the base current $I_3$ is positive, and a voltage Vo appearing at the output terminal 40 connected to the collector of the transistor 34 becomes equal to ground level as shown in FIG. 2D. When the base current $I_3$ is negative, the transistor 34 is made nonconductive and the output voltage Vo becomes equal to the level of the voltage appearing at the power source terminal 10 as shown in FIG. 2D.

As described above, the circuit shown in FIG. 1 serves to function as a window comparator circuit because (1) the output voltage Vo becomes an L level when the input voltage Vi is lower than the second reference voltage Vl and when the input voltage Vi is higher than the first reference voltage Vh and because (2) the output voltage Vo becomes the H level when the input voltage Vi is higher than the second reference voltage Vl and lower than the first reference voltage Vh, as shown in FIG. 2D.

Figure 3:
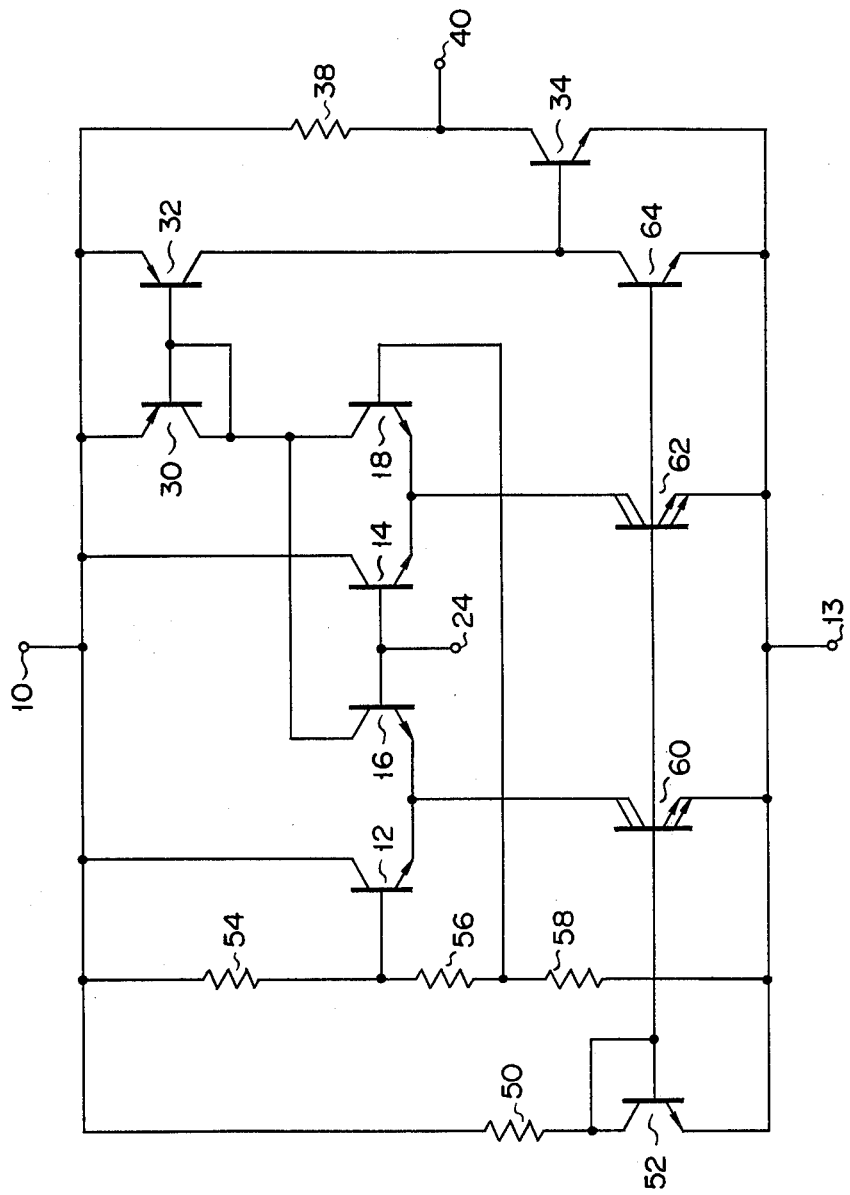
FIG. 3 is a circuit diagram of the first embodiment in detail.

FIG. 3 is a circuit diagram of a concrete circuit of the first embodiment. Same parts as those shown in FIG. 1 are represented by same reference numerals and description about these parts is omitted. The power source terminal 10 is connected via a resistor 50 to the collector of an NPN-type transistor 52, whose base and collector are short-circuited with each other and whose emitter is connected to the second power source terminal 13. Resistors 54, 56 and 58 are connected in series between the power source terminals 10 and 13, and a connection point between the resistors 54 and 56 is connected to a base of the transistor 12. This connection point corresponds to the first reference voltage terminal 26 shown in FIG. 1.

A connection point between the resistors 56 and 58 is connected to a base of the transistor 18. This connection point corresponds to the second reference voltage terminal 28 shown in FIG. 1. Emitters of the transistors 12 and 16 are coupled to a collector of an NPN-type transistor 60, whose emitter is connected to the second power source terminal 13. Emitters of the transistors 14 and 18 are connected to a collector of an NPN-type transistor 62, whose emitter is coupled to the second power source terminal 13. A collector of the transistor 32 is connected to a collector of an NPN-type transistor 64, whose emitter is connected to the second power source terminal 13. Bases of the transistors 60, 62 and 64 are connected to the base of the transistor 52.

Each of the transistors 60 and 62 has a geometrical shape two times that of other transistors. Namely, the transistors 60, 62 and 64 correspond to the constant current sources 20, 22 and 36 shown in FIG. 1, respectively. As the result, the circuit shown in FIG. 3 effects the same operation as that of circuit shown in FIG. 1 and waveforms in same portions are same as those shown in FIGS. 2A through 2D.

Description has been made above assuming that the first and second reference voltages are of same polarity as that of the input signal, but it may be assumed that the first power source terminal be positive and the second power source terminal negative. Even if the first and second reference voltages become positive and negative, respectively, the same operation can be achieved when the input signal is applied between the first and second reference voltages.

As described above, this embodiment allows eleven elements including the current supply sources to be sufficient to realize the window comparator circuit suitable for integrating. In addition, only three transistors at most are connected in series to each line between the first and second power source terminals 10 and 13, thus allowing a voltage supplied between the power source terminals 10 and 13 to be about 2 V.

Figure 4:
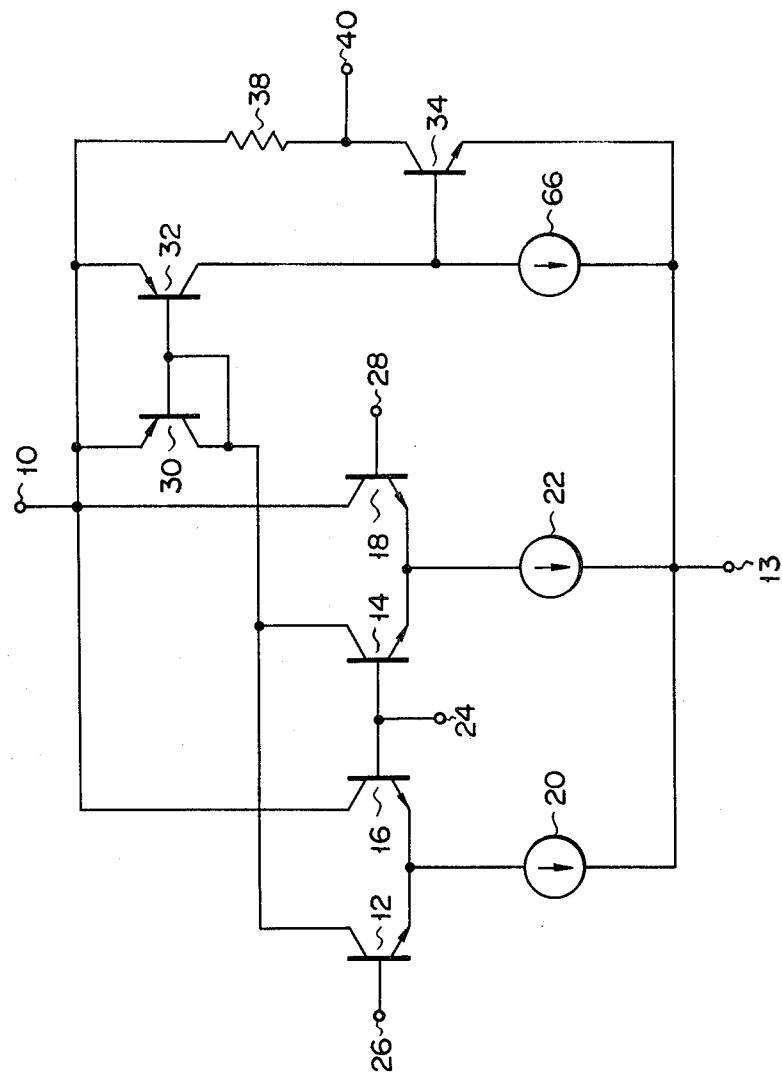
FIG. 4 is a circuit diagram of a second embodiment of a window comparator circuit according to the present invention.

A second embodiment of the window comparator circuit according to the present invention will be now described referring to FIG. 4. Same parts as those shown in FIG. 1 are represented by same reference numerals and description about these parts is omitted. A power source terminal 10 is connected to collectors of transistors 16 and 18, and collectors of transistors 12 and 14 are connected to a collector of an input side transistor 30 of a current mirror circuit. A collector of an output side transistor 32 of the current mirror circuit is connected to a constant current source 66 for supplying a constant current 3I. Other parts are same as those of the first embodiment.

When the input voltage Vi is sufficiently lower than a first reference voltage Vh, the transistor 12 is made conductive while the transistor 16 becomes nonconductive, and all of the output current 2I of the constant current source 20 flows only through the transistor 12. When the input voltage Vi rises near to Vh, the transistor 16 is also made conductive and a little current flows through the transistor 16. When Vi becomes equal to Vh, the transistors 12 and 16 are made equally conductive and the output current I resulted from dividing the current 2I of the constant current source 20 into two equal parts flows through the transistors 12 and 16, respectively.

Figure 5A:
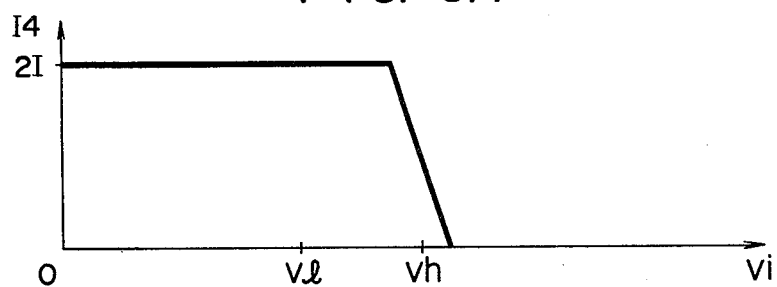
FIGS. 5A through 5D show signal waveforms in main parts of the circuit of FIG. 4.

When Vi becomes sufficiently higher than Vh, the transistor 16 is then made conductive while the transistor 12 becomes nonconductive, and all of the output current 2I of the constant current source 20 flows through the transistor 16. As the result, a collector current $I_4$ of the transistor 12 varies relative to the input voltage Vi as shown in FIG. 5A. The characteristic of $I_4$ when $Vi \approx Vh$ is approximated by a straight line.

When the input voltage Vi is sufficiently lower enough than the second reference voltage Vl, the transistor 14 is made nonconductive while the transistor 18 becomes conductive, and all of the output current 2I of the constant current source 22 flows only through the transistor 18. When Vi becomes near to Vl, the transistor 14 is also made conductive and a little current flows through the transistor 14.

Figure 5B:
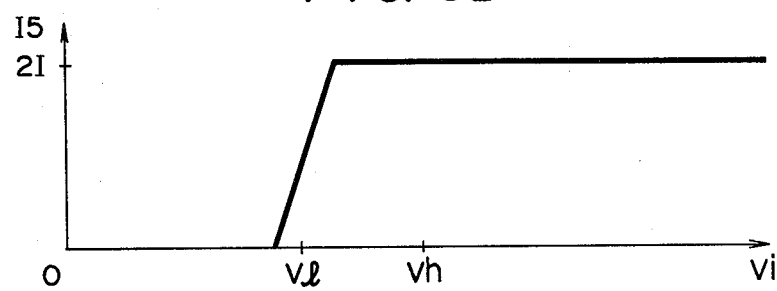

When Vi becomes equal to Vl, the transistors 14 and 18 are rendered equally conductive, and the current I resulted from dividing the output current 2I of the constant current source 22 into two equal parts flows through the transistors 14 and 18. When Vi becomes sufficiently higher than Vl, the transistor 14 is made conductive while the transistor 18 becomes nonconductive, and all of the output current 2I of the constant current source 22 flows through the transistor 14. As the result, a collector current $I_5$ of the transistor 14 varies relative to the input voltage Vi as shown in FIG. 5B. The characteristic of $I_5$ when $Vi \approx Vl$ is approximated by a straight line.

Figure 5C:
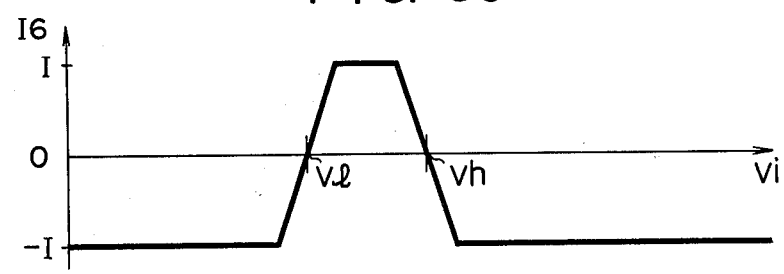
Figure 5D:
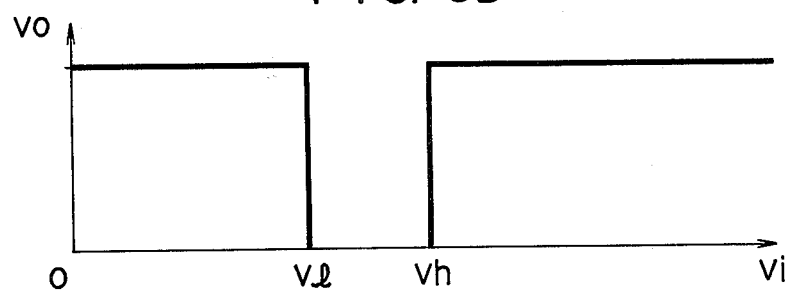

Since the collector currents $I_4$ and $I_5$ of the transistors 12 and 14 are supplied to the collector of the transistor 30, a collector current of the transistor 32 is the sum of $I_4 I_5$. Since the constant current source 66 for supplying the constant current 3I is connected to the collector of the transistor 32, a base current $I_6$ of the transistor 34 varies relative to the input voltage Vi as shown in FIG. 5C. Namely, $I_6$ has a waveform corresponding to the one which is formed by unifying the waveform of $I_4$ and $I_5$ shown in FIGS. 5A and 5B and then shifting it by 3I to the negative side. As the result, a voltage Vo appearing at the output terminal 40 connected to the collector of the transistor 34 becomes as shown in FIG. 5D.

As described above, a window comparator circuit whose output level is reverse to that of the first embodiment is provided according to the second embodiment because the output voltage Vo becomes the H level when the input voltage Vi is lower than the second reference voltage Vl and when Vi is higher than the first reference voltage Vh and becomes the L level when the input voltage Vi is higher than the second reference voltage Vl and lower than the first reference voltage Vh.

FIG. 6 is a circuit diagram of a concrete circuit of the second embodiment. NPN-type transistors 60 and 62, each having a geometrical shape two times that of other transistors, are employed as the constant current sources 20 and 22, and an NPN-type transistor 68 having a geometrical shape three times that of other transistors is employed as the constant current source 66. In this case, too, the number of elements may be eleven and voltage supplied to the power source terminal may be about 2 V.

It should be understood that the present invention is not limited to the above-mentioned embodiments and that various modification and variation can be made according to the accuracy required. As described above, the present invention provides a window comparator circuit having a smaller number of elements and a simpler circuit arrangement and suitable for integrating.

What is claimed is:

1. A window comparator circuit comprising:
    an input terminal to be supplied with an input signal;
    a first reference voltage terminal to be supplied with a first voltage;
    a second reference voltage terminal to be supplied with a second voltage lower than the first voltage;
    first differential amplifier means having a first transistor whose base is connected to the first reference voltage terminal, and a second transistor whose base is connected to the input terminal and whose emitter is connected to an emitter of the first transistor;
    a first constant current source for supplying a first constant current and connected to the emitters of said first and second transistors;
    second differential amplifier means having a third transistor whose base is connected to the input terminal, and a fourth transistor whose base is connected to the second reference voltage terminal and whose emitter is connected to the emitter of said third transistor;
    a second constant current source for supplying a second constant current having the same value as the first constant current and connected to the emitters of said third and fourth transistors;
    a current mirror circuit to be supplied with one of the sum of collector currents of said second and fourth transistors and the sum of collector currents of said first and third transistors;
    a third constant current source for supplying a third constant current having a value different from the first and the second constant currents and connected to an output terminal of said current mirror circuit; and
    an output transistor whose base is connected to an output terminal of said current mirror circuit.

2. A window comparator circuit according to claim 1, wherein the sum of collector currents of said second and fourth transistors is supplied to said current mirror circuit, and said third constant current supplied from said third constant current source is equal to half of said first constant current supplied from said first constant current source.

3. A window comparator circuit according to claim 1, wherein the sum of collector currents of said first and third transistors is supplied to said current mirror circuit, and said third constant current supplied from said third constant current source equal to 1.5 times said first constant current supplied from said first constant current source.

* * * * *